United States Patent [19]
Synder et al.

[11] Patent Number: 5,910,742
[45] Date of Patent: Jun. 8, 1999

[54] CIRCUIT AND METHOD FOR DATA RECOVERY

[75] Inventors: Warren S. Synder, Snohomish; Timothy J. Williams, Bellevue, both of Wash.

[73] Assignee: Cypress Semiconductor Corp., San Jose, Calif.

[21] Appl. No.: 08/877,683

[22] Filed: Jun. 16, 1997

[51] Int. Cl.[6] .................................................. H04L 7/02
[52] U.S. Cl. ......................... 327/165; 327/144; 375/359
[58] Field of Search ................................. 375/359, 360; 395/556; 327/141, 144, 151, 160, 161, 165, 166

[56] References Cited

U.S. PATENT DOCUMENTS

| | | | |
|---|---|---|---|
| 4,611,335 | 9/1986 | Arai et al. ................................. | 375/110 |
| 4,942,590 | 7/1990 | Terada ........................................ | 375/1 |
| 4,965,884 | 10/1990 | Okura et al. ............................. | 375/106 |
| 5,022,056 | 6/1991 | Henderson et al. ..................... | 375/119 |
| 5,022,057 | 6/1991 | Nishi et al. .............................. | 375/119 |
| 5,046,075 | 9/1991 | Kraemer et al. ........................ | 375/119 |
| 5,185,768 | 2/1993 | Ferraiolo et al. ....................... | 375/119 |
| 5,245,637 | 9/1993 | Gersbach et al. ....................... | 375/119 |
| 5,412,311 | 5/1995 | Rothermel ............................. | 324/76.82 |
| 5,452,324 | 9/1995 | Lewis et al. ............................. | 375/373 |
| 5,491,729 | 2/1996 | Co et al. ................................. | 375/376 |
| 5,610,953 | 3/1997 | Betts et al. .............................. | 375/373 |
| 5,640,523 | 6/1997 | Williams ................................. | 375/360 |
| 5,652,767 | 7/1997 | Kiyonaga et al. ...................... | 327/144 |
| 5,671,258 | 9/1997 | Burns et al. ............................ | 375/359 |
| 5,675,813 | 10/1997 | Holmdahl ............................... | 395/750 |
| 5,689,530 | 11/1997 | Honaker, Jr. ........................... | 375/286 |

FOREIGN PATENT DOCUMENTS 9736230  10/1997  WIPO .

OTHER PUBLICATIONS

Universal Serial Bus Specification, Chapter 7—Electrical, Jan. 15, 1996, pp. 111–143.

Design Guide for a Low Speed Buffer for the Universal Serial Bus Revision 1.1, Dec., 1996 Intel Corporation, pp. 1–29.

*Primary Examiner*—Timothy P. Callahan
*Assistant Examiner*—Tuan T. Lam
*Attorney, Agent, or Firm*—Christopher P. Maiorana; Maiorana & Acosta, P.C.

[57] ABSTRACT

A circuit and method for synchronizing a data signal to one of a plurality of clocks. The clock may include (i) a pulse generator configured to generate two pulses separated by a delay, (ii) a clock generator configured to generate the plurality of clocks, and (iii) a logic circuit configured to select the clock for synchronizing the data signal.

14 Claims, 3 Drawing Sheets

CIRCUIT AND METHOD FOR DATA RECOVERY

FIELD OF THE INVENTION

The present invention relates to digital circuits generally and, more particularly, to a circuit and method for data recovery in a digital circuit.

BACKGROUND OF THE INVENTION

The universal serial bus (USB) is a multi-functional bus that allows a variety of computer peripherals to be connected to and communicate through a common generic port. Implementation of a universal serial bus device involves a variety of design considerations including synchronizing data, which may be referred to as data recovery. Conventional USB designs may implement a phase lock loop (PLL) for synchronizing timing relationships. However, a PLL may be complex (relative to other components on the USB device) and may consume a large area to implement. Since a PLL is a reactive device, it generally cannot synchronize incoming data after a single transition. As a result, a PLL generally has difficulty quickly acquiring the proper phase locking with respect to incoming data (i.e., within two timing cycles or less).

SUMMARY OF THE INVENTION

The present invention concerns a circuit comprising a pulse generator configured to generate two pulses separated by a delay. The circuit may further comprise a clock generator configured to generate a plurality of clocks and/or a logic circuit configured to select the clock signal having the closest timing relationship with the data signal. The logic circuit may then synchronize the data signal with the selected clock.

The objects, features and advantages of the present invention include providing a circuit and method for synchronizing a data signal with a clock selected from a number of clocks, synchronizing data in a short amount of time, providing accurate synchronization of the signals and providing dynamic synchronization of the clocks as they shift in time with respect to the incoming data signal.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a circuit and method for synchronizing a stream of data with the closest one of a number of clock signals. In one example, the number of clocks may be four. The circuit may generate a pair of pulses (e.g. synchronizing pulses) separated by a delay. The delay must generally be large enough so that proper sampling of a number of clock circuits will occur during at least one of the two pulses.

The clocks may be analyzed at each of the synchronizing pulses so that the circuit may determine which of the four clocks has the closest timing. If both pulses occur while one of the clock signals has a particular logic level (e.g. a binary HIGH or "1"), then that particular clock signal may be selected due to its having the closest phase relationship to the data signal. If one synchronizing pulse is high during one clock, while the second synchronizing pulse is high during the next clock, the second clock may be selected because of the degree of confidence one may have in maintaining data signal integrity when synchronized to that particular clock signal. If one of the synchronizing pulses corresponds to an edge of one of the clocks, an indeterminate (or invalid) result may occur for that pulse. The use of two pulses separated in time may assure that only one pulse may cause an indeterminate result. A valid result is generally provided for at least one synchronizing pulse under such conditions. A selection device may then properly select the appropriate clock having the closest phase relationship to the data (to be described in detail with respect to FIG.6). In this case, the selected clock would have clock edges near the transition of the incoming data signal. Alternately, the selection device may be configured to select a clock with edges away from the data transition in order to sample the data signal during a stable time. This may be done by using known phase relationships between the internal clocks to select the optimal clock after the clock that aligns to the data transition is determined. Since the two synchronizing pulses may be generated in response to each transition of the data signal, the present invention may quickly synchronize the data signal to one of the clocks.

Figure 1:
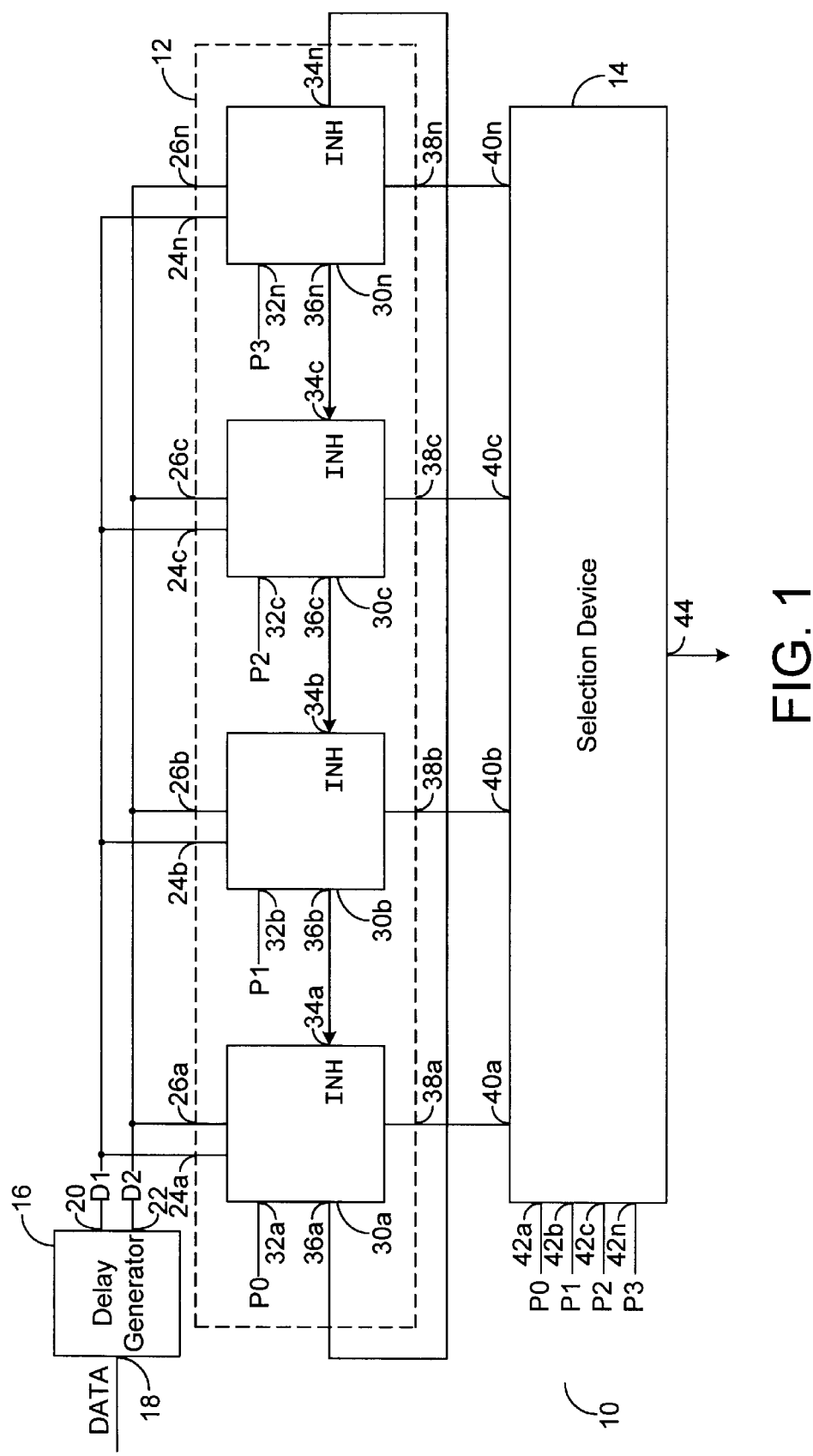
FIG. 1 is a block diagram illustrating a preferred embodiment of the present invention.

Referring to FIG. 1, a block diagram of a circuit 10 is shown in accordance with a preferred embodiment of the present invention. The circuit 10 generally comprises a logic section (or circuit) 12, a selection device (or circuit) 14 and a delay generator (or circuit) 16. The delay generator 16 has an input 18 that may receive an input signal (e.g., DATA). The delay generator 16 may have a first output 20 that generally presents a first signal (or pulse, e.g., D1) and a second output 22 that generally presents a second signal (or pulse, e.g., D2). The first signal D1 is generally presented to two or more inputs of the logic section 12 (e.g., a first input 24a, a second input 24b, a third input 24c and an fourth input 24n). Similarly, the second signal D2 may also be presented to two or more inputs of the logic section 12 (e.g., a first input 26a, a second input 26b, a third input 26c and a fourth input 26n). The logic section 12 generally comprises two or more logic devices (e.g., a first logic device 30a, a second logic device 30b, a third logic device 30c and a fourth logic device 30n). The number of logic devices 30a–30n may be selected to fit the design criteria of a particular application.

At least one logic device (e.g., 30a) generally has an input 32a that may receive an external clock signal (e.g., P0). The other logic devices (e.g., 30b, 30c and 30n) generally have an input (e.g., 32b, 32c and 32n) that may receive additional clocks signals (e.g., P1, P2 and P3). The signals P0, P1, P2 and P3 are generally clock signals that provide successive pulses (to be described in more detail with respect to FIG. 2) such that at least one of the clock signals has a particular logic level at any given time.

Generally, one or more of the clock signals may be external, and the remainder of the clock signals may be externally or internally generated (e.g., by a ring counter or other circuit). The logic device 30a may have an input 34a that may receive a signal (e.g., INH) from an output 36b of the logic device 30b, the logic device 30b may have an input 34b that receives a signal from an output 36c, the logic device 30c may have an input 34c that receives a signal from an output 36n of the logic device 30n and a logic device 30n may have an input 34n that receives a signal from the output 36a of the logic device 30a.

Each logic device 30a–30n may have an output that is presented to the selection device 14. For example, each logic device 30a, 30b, 30c and 30n may have an output 38a, 38b, 38c and 38n that is generally presented to an input 40a, 40b, 40c and 40n, of the selection device 14. The selection device 14 may also have inputs 42a–42n, which may receive clocks similar to the clocks P0, P1, P2 and Pn presented to logic devices 30a, 30b, 30c and 30n. The logic devices 30a–30n may present control signals at the outputs 38a–38n indicating which clock has the proper phase, but may not necessarily present the particular clock signals P0, P1, P2 and Pn to the output 44. The control signals presented to the selection device 14 may select one of the clocks P0, Pl, P2 and Pn to be presented to the output 44 from the inputs 42a–42n. The selection device 14 may be implemented as a multiplexer that presents the selected clock signal in response to the control signals generated by the logic devices 30a–30n. The signal INH generally provides a bit that may inhibit the output from the preceding logic device. This may synchronize data by inhibiting all but one output (e.g., 38a), thus selecting one clock, P0, P1, P2 or Pn.

Figure 2:
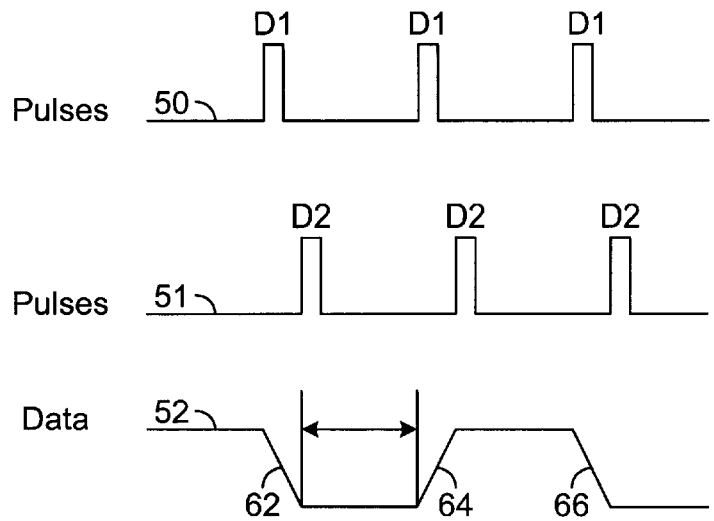
FIG. 2 is a timing diagram illustrating the various signals of the present invention.
Figure 2:
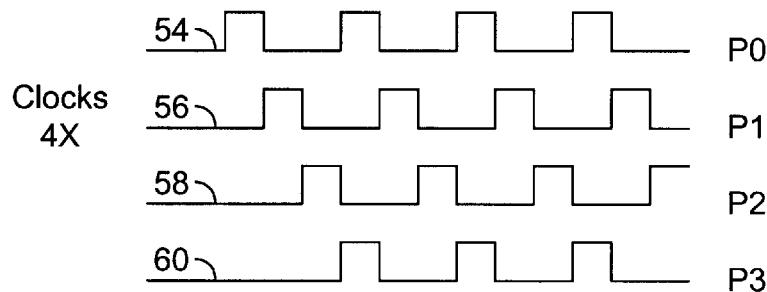

Referring to FIG. 2, a timing diagram is shown illustrating a synchronizing pulse waveform 50, a syncronizing pulse waveform 51 a data waveform 52 (which may be periodic), a first clock waveform 54, a second clock waveform 56, a third clock waveform 58 and a fourth clock waveform 60. The waveform 50 generally represents the synchronizing pulses. D1 and the waveform 51 generally represents the synchronizing pulses D2. The waveform 52 generally represents the data input signal. The waveforms 54, 56, 58 and 60 generally represent timing signals P0, Pl, P2 and P3. The waveforms 50 and 51 are shown having a first pulse D1 and a second pulse D2 which may be repeated at each transition of the data signals at either a rising or a falling transition of the signal DATA, or at a predetermined data cycle interval (e.g. every other transition, every third transition, every fourth transition, etc.).

The first instance of the pulses D1 and D2 is shown to occur in response to a falling edge 62 of the waveform 52. The second instance of the pulses D1 and D2 is shown to occur in response to a rising edge 64 of the waveform 52. The third instance of the pulses D1 and D2 is shown to occur in response to a falling edge 66 of the waveform 52. The relationship between the waveform 50 and the waveform 52 shows one example of where the rising edge 64 and the falling edge 66 may fall with respect to the pulses D1 and D2. Generally, if one of the pulses D1 or D2 occurs when a clock signal 54, 56, 58 or 60 is high, that clock waveform my be recognized as having a close phase relationship to the data, and may be selected as the proper clock.

The delay generator 16 generally provides the pulses D1 and D2 in response to the transitions of the data signal. The delay generator 16 may be implemented as a conventional two-pulse generator circuit, see e.g., U.S. patent application Ser. Nos. 08/581,073 (filed Dec. 29, 1995) and/or 08/330, 930 (filed Oct. 28, 1994), the relevant portions of which are hereby incorporated by reference. The two-pulse generator may be implemented as a delay line and an XOR gate for each output pulse D1 and D2.

Figure 3:
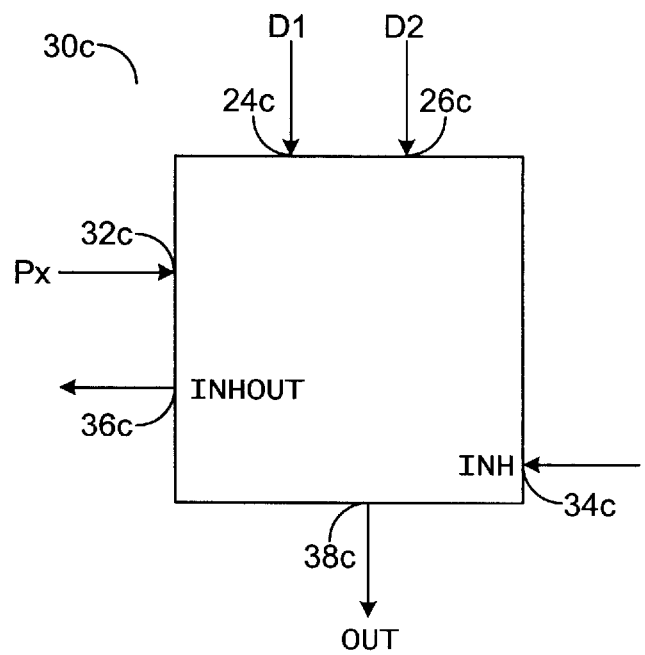
FIG. 3 is a more detailed diagram of a particular block shown in FIG. 1.

Referring to FIG. 3, a detailed view of a logic device (e.g. 30c) is shown. The logic devices 30a, 30b and 30n have a similar configuration. The logic devices may be monolithic (i.e. on a single chip) or may be located on a separate integrated circuit.

Figure 4:
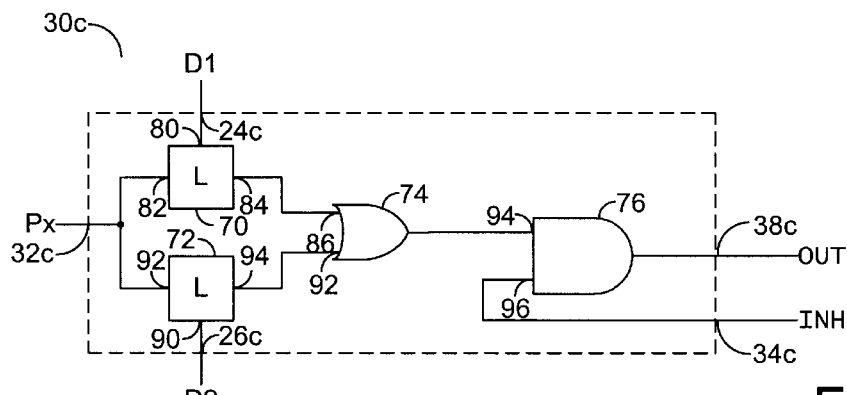
FIG. 4 is a diagram showing a specific implementation of a subcircuit implementing the selection device of FIG. 1.

Referring to FIG. 4, a more detailed diagram of a logic device 30c is shown. The logic device 30c generally comprises a first latch 70, a second latch 72, an OR gate 74 and an AND gate 76. The latch 70 has an input 80 that generally receives the signal D1 and an input 82 that generally receives the signal Px. The latch 70 has an output 84 that may present a signal to an input 86 of the OR gate 74. The latch 72 has an input 90 that may receive the pulse D2 and an input 92 that may receive the signal Px. The latch 72 has an output 94 that may present a signal to an input 92 of the OR gate 74. The OR gate may present a signal to an input 94 of the AND gate 76. The AND gate 76 presents a signal at the output 38c that generally corresponds to Px being recognized as having a close phase relationship to the data when signal INH is de-asserted or in a high logic state. Depending on the states of the various signals (e.g. the synchronizing pulses, the signal INH, the signal DATA) and/or the desired active state of the logic device output, the OR gate may be replaced with a NOR gate, and the AND gate may be replaced with a NOR gate. The latches 70 and 72 may be implemented as clock comparators having an output that tracks the input and then holds the sampling input.

Figure 5:
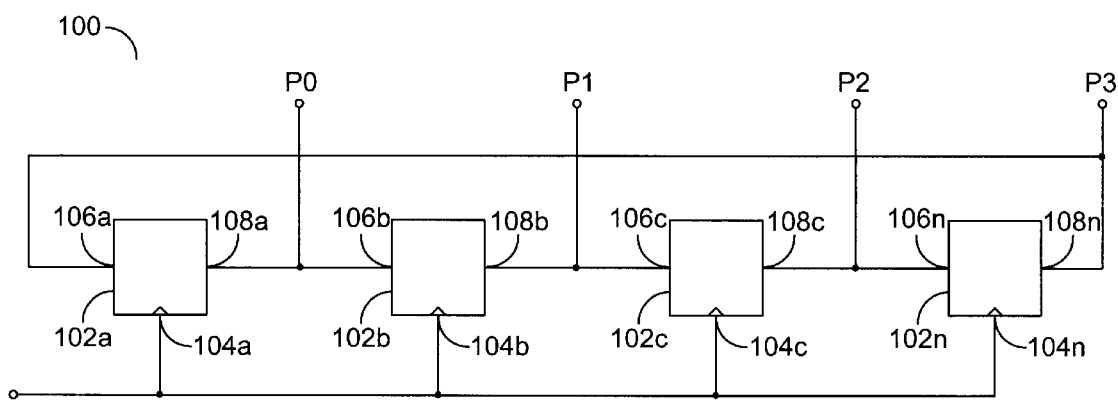
FIG. 5 is a diagram of a ring counter that may generate some of the signals of FIG. 2.

Referring to FIG. 5, the ring counter 100 generally comprising a first clock cell 102a, a second clock cell 102b, a third clock cell 102c and a fourth clock cell 102n is shown. Each clock cell 102a–102n may have an input 104a–104n that may receive an external input clock IN. The cell 102b has an input 104b that may receive the input clock IN. The cell 102c has an input 104c that may receive the clock signal IN. The cell 102n has an input 104n that may receive the clock signal IN. The first clock cell 102a may also have an input 106a that may receive a feedback signal from the last cell 102n of the ring counter 100. The first cell 102a has an output 108a that may present a first clock signal P0. The signal P0 may be presented to an input 106b of the second cell 102b, as well as to the first logic device (e.g., 32a) shown in FIG. 1. Similarly, the other clock cells 102b, 102c . . . 102n each have an output 108b, 108c . . . 108n, that may present the signals P1, P2 . . . Pn to clock each input 106c . . . 106n, 106a respectively. As a result, the ring counter 100 generates the waveforms P0, P1, P2 and P3 which may be used by the circuit 10. The number of stages in the ring counter 100 may be adjusted if a different number of clocks P0, P1 . . . PN is desired.

Figure 6:
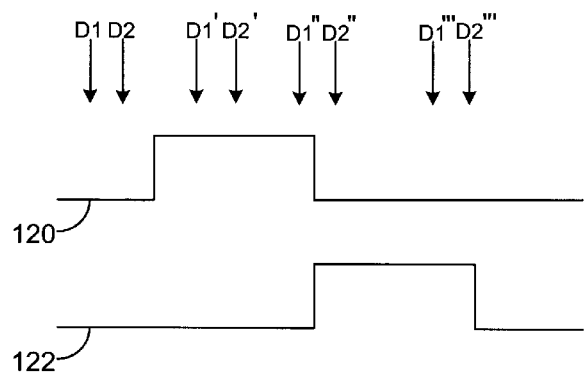
FIG. 6 is a timing diagram illustrating the selection between two particular waveforms.

FIG. 6 shows a timing diagram illustrating the selection between two particular waveforms. Transitions of a first clock waveform 120 and a second clock waveform 122 are shown as a function of time. Waveforms 120 and 122 represent two successive clock waveforms, e.g., P0 and P1 in FIG. 2. The times at which four pairs of pulses D1 and D2 are asserted are shown as arrows intercepting the time axis/dimension. The first set of pulses D1 and D2 is shown at a point when neither waveform 120 or 122 is high. As a result, neither of the waveforms 120 or 122 will be selected. The second set of pulses D1' and D2' are shown at a point where the waveform 120 is high. As a result, the waveform 120 will be selected. The third set of pulses D1" and D2" are shown where the pulse D1" is at a point where the waveform 120 is high and the pulse D2" is at a point where the waveform 122 is high. As a result, the waveform 122 will be aligned with the data signal, since waveform 120 will be disabled by the INH signal of the corresponds logic device 30a–30n. Finally, the fourth set of pulses Di''' and D2''' are shown at times where the waveform 122 is high during D1''' and during the D2'''. As a result, the waveform 122 will be aligned with the data signal. The four locations of the pulses D1 and D2 illustrate four combinations of possibilities and the corresponding alignments for two of the clock signal appropriate waveforms (e.g. P1, Pi, P2 or P3). Generally, when one waveform is aligned, the remaining waveforms are disabled by the signal INH of the corresponding logic device 30a–30n.

If one of the pulses D1 or D2 occurs at the time when waveform 120 is falling and waveform 122 is rising, an indeterminate result may occur at the output of one or more sampling latches (devices 80 or 90 in FIG. 4). The use of two pulses separated in time generally insures that a valid result occurs at the other sampling pulse. This may be sufficient to guarantee that the proper synchronizing clock will be selected.

Two non-ideal cases can occur for the waveforms 120 and 122 of FIG. 6. At the falling edge of 120 and rising edge of 122, both waveforms might briefly be both high or both low. Proper operation still occurs when one of the two waveforms 120 and 122 are high. This requirement may be met by either insuring that 120 and 122 overlap briefly, or by insuring that pulses D1 and D2 are separated by a time greater than the time during which waveforms 120 and 122 are both low at the falling edge of 120.

While the invention has been particularly shown and described with reference to the preferred embodiments thereof, it will be understood by those skilled in the art that various changes in form and details may be made without departing from the spirit and scope of the invention.

We claim:

1. A circuit comprising:
    a pulse generator configured to generate at least two synchronizing signals, each synchronizing signal having pulses generated at each transition of a data signal;
    a clock generator circuit configured to generate a plurality of clock signals; and
    a logic circuit configured to: (i) select one of said clock signals in response to said pulses of said synchronizing signals and (ii) synchronize said data signal with said selected clock signal.

2. The circuit according to claim 1 wherein said clock generator circuit comprises a ring counter.

3. The circuit according to claim 1 wherein said plurality of clock signals are equally spaced, such that one of said plurality of clock signals is at a first state and the remainder of said plurality of clock signals are at a second state.

4. The circuit according to claim 3 wherein said plurality of clock signals comprises four equally spaced clock signals.

5. The circuit according to claim 1, wherein said logic circuit comprises a number of logic devices equal to the number of said clock signals.

6. The circuit according to claim 5, wherein each of said logic devices inhibits a preceding logic circuit from selecting one of said clock signals when another one of said logic devices selects another one of said clock signals.

7. A universal serial bus (USB) device comprising the circuit according to claim 1.

8. A circuit comprising:
    means for generating at least two two said synchronizing signals, each synchronizing signal having pulses generated at each transition of a data signal;
    means for generating a plurality of clock signals; and
    means for selecting one of said clock signals in response to said pulses of said synchronizing signals for synchronizing with said data signal.

9. The circuit according to claim 8 wherein said means for generating a plurality of clock signals comprises a ring counter.

10. The circuit according to claim 8 wherein said plurality of clock signals are equally spaced such that one of said plurality of clock signals is at a first state and the remainder of said plurality of clock signals are at a second state.

11. The circuit according to claim 8, wherein means for selecting further comprises means for inhibiting the selection of another of said clock signals when said one of said clock signals is selected.

12. A universal serial bus (USB) device comprising the circuit according to claim 8.

13. A method for synchronizing data signal with one of a plurality of clock signals comprising the steps of:
    generating two synchronizing signals, each synchronizing signal having pulses generated at each transition of a data signal; and
    detecting when said pulses of said synchronizing signals occur within a predetermined time of a selected one of a plurality of clock signals, said detecting for synchronizing said data signal with said selected one of said clock signals.

14. The method according to claim 13 wherein said plurality of clock signals are equally spaced, such that one of said clock signals is at a first state and the remainder of clock signals are at a second state.

* * * * *